United States Patent
Araki et al.

(10) Patent No.: US 6,441,619 B1
(45) Date of Patent: Aug. 27, 2002

(54) REMAINING CHARGE DETECTION DEVICE FOR POWER STORAGE UNIT

(75) Inventors: Kazuhiro Araki; Naoki Maruno; Yasuo Yamada, all of Wako (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/911,396

(22) Filed: Jul. 25, 2001

(30) Foreign Application Priority Data

Jul. 28, 2000 (JP) ........................................ 2000-230074

(51) Int. Cl.[7] .......................... G01N 27/416; H02V 7/00
(52) U.S. Cl. ........................................ 324/427; 320/134
(58) Field of Search ............................... 320/132, 134, 320/136; 324/427, 429

(56) References Cited

U.S. PATENT DOCUMENTS

| | | | | |
|---|---|---|---|---|
| 4,151,454 A | * | 4/1979 | Iida | 320/134 |
| 5,122,751 A | * | 6/1992 | Aita et al. | 324/426 |
| 5,381,096 A | * | 1/1995 | Hirzel | 320/DIG. 21 |
| 5,808,455 A | * | 9/1998 | Schwartz et al. | 323/271 |
| 6,025,968 A | * | 2/2000 | Friel et al. | 112/130 |
| 6,037,749 A | * | 3/2000 | Parsonage | 320/132 |
| 6,232,744 B1 | * | 5/2001 | Kawai et al. | 180/65.3 |
| 6,262,577 B1 | * | 7/2001 | Nakao et al. | 320/135 |

FOREIGN PATENT DOCUMENTS

| | | | | |
|---|---|---|---|---|
| JP | 10104324 A | * | 4/1995 | G01R/31/36 |
| JP | 10-132911 | | 5/1998 | |
| JP | 10153647 A | * | 6/1998 | G01R/31/36 |

* cited by examiner

*Primary Examiner*—Gregory Toatley
(74) *Attorney, Agent, or Firm*—Arent Fox Kintner Plotkin & Kahn, PLLC

(57) ABSTRACT

A remaining charge detection device for a power storage unit including a current detection unit which detects the current value of a charging current and a discharging current of a power storage unit; a voltage detection unit which detects the voltage value of a terminal voltage of the power storage unit; and a current accumulation remaining charge calculation means which accumulates the current value detected by the current detection unit to obtain an accumulated charging current and discharging current and calculates a remaining charge of the power storage unit. The remaining charge detection device further includes a no-load state detection unit which detects a no-load state of the power storage unit, and a remaining charge for calibration calculation unit which calculates a remaining charge for calibration for the remaining charge of the power storage unit.

12 Claims, 3 Drawing Sheets

REMAINING CHARGE DETECTION DEVICE FOR POWER STORAGE UNIT

BACKGROUND OF THE INVENTION

1. Field of the Invention

The present invention relates to a remaining charge detection device for a power storage unit, such as a battery. More specifically, the present invention relates to a remaining charge detection device for a power storage unit, which utilizes a technique of calibrating the remaining charge calculated based on a current accumulation method.

2. Description of Related Art

As a method for detecting the remaining charge of a power storage unit (e.g., a battery) which is provided in, for instance, a hybrid car, one is generally known in which the accumulated charge amount and the accumulated discharge amount of the battery are calculated by estimating the charging current and the discharging current of the battery for each given period of time, and adding or subtracting the accumulated charge amount/the accumulated discharge amount to/from the initial charge or the remaining charge of the battery prior to the charging-discharging processes, since the remaining charge of the battery corresponds to the total amount of electric charge retained in the battery.

However, in the above-mentioned method, for instance, measurement errors in the current detector accumulate when the accumulated charge amount and the accumulated discharge amount are calculated, and errors contained in the calculated remaining charge may be increased.

Because of the problems described above, as a remaining charge detection device for a battery, which is capable of calibrating the remaining charge calculated based on the above-mentioned current accumulation method to an accurate value at a suitable timing, Japanese Unexamined Patent Application, First Publication No. 10-132911, for instance, discloses a battery remaining charge detector in which predetermined relational expressions or maps for current values, voltage values, and remaining charges for the battery are stored. The battery remaining charge detector calculates the remaining charge of the battery based on the current value and the voltage value of the charging/discharging current of the battery detected by a current detector and a voltage detector, respectively, and carries out a calibration of the calculated remaining charge based on the stored relational expressions or maps.

However, since the predetermined relational expressions or maps retained in the above-mentioned battery remaining charge detector are prepared based on the voltage characteristic of a battery in its stationary state (i.e., the battery has not deteriorated), there is a difference between the actual remaining charge of the battery and the remaining charge of the battery calculated based on the predetermined maps or relational expressions, and the difference may be increased when the internal resistance of the battery is increased by, for instance, the deterioration of the battery. If a value which contains an error is detected as the remaining charge of a battery, the battery may be used exceeding its limit and the life of the battery may be shortened.

Also, when the remaining charge of a battery is defined as a percentage with respect to a predetermined standard charge of the battery and such a percentage value is used for controlling a motor or an engine, problems may arise in controlling the motor or engine and they may not be properly controlled if the degree of deterioration of the battery is not reflected to the standard charge of the battery.

SUMMARY OF THE INVENTION

The present invention is achieved in consideration of the above situation, and its objectives include the provision of a remaining charge detection device for a power storage unit, which enables calculation, even if the power storage unit has deteriorated, of an accurate remaining charge thereof based on an accumulated charge amount and an accumulated discharge amount obtained by estimating a charging current and a discharging current.

Accordingly, the present invention provides a remaining charge detection device for a power storage unit (for instance, a battery 14 in an embodiment of the invention which will be described later) including: a current detection unit (for instance, a current detector 26 in an embodiment of the invention which will be described later) which detects the current value of a charging current and a discharging current of a power storage unit; a voltage detection unit (for instance, a voltage detector 28 in an embodiment of the invention which will be described later) which detects the voltage value of a terminal voltage of the power storage unit; and a current accumulation remaining charge calculation means (for instance, step S02 in an embodiment of the invention which will be described later) which accumulates the current value detected by the current detection unit to obtain an accumulated charging current and an accumulated discharging current and, based on the accumulated charging current and the accumulated discharging current, calculates a remaining charge (for instance, a detected remaining charge SOC in an embodiment of the invention which will be described later) of the power storage unit;

wherein the remaining charge detection device further includes: a no-load state detection unit (for instance, a current consumer releasing unit 23 in an embodiment of the invention which will be described later) which detects a no-load state of the power storage unit; and a remaining charge for calibration calculation unit (for instance, a remaining charge for calibration calculation unit 25 in an embodiment of the invention which will be described later) which calculates, according to the voltage value detected in the no-load state of the power storage unit (for instance, OCV in an embodiment of the invention which will be described later), a remaining charge for calibration (for instance, a remaining charge $SOC_{OCV}$ in an embodiment of the invention which will be described later) with respect to the remaining charge of the power storage unit.

According to the above remaining charge detection device for a power storage unit, the upper limit and the lower limit of the remaining charge of the power storage unit are determined, for instance, from the viewpoint of protecting the power storage unit, so that the remaining charge calculated by the current accumulation method varies within a predetermined range. Also, predetermined map(s) which show the relationships between the temperature, current, and voltage of the power storage unit corresponding to the upper limit and the lower limit of the remaining charge are provided. The maps are constructed based on a stationary state of the power storage unit having no deterioration, e.g., based on the initial state of the power storage unit.

When an internal resistance of the power storage unit increases due to such factors as the deterioration thereof, it may be erroneously determined that the actual remaining charge of the power storage unit has reached the upper limit, which, in fact, it has not, because the detected terminal voltage of the power storage unit has reached the upper limit voltage corresponding to the map of the upper limit remaining charge. According to the present invention, however, a no-load state of the power storage unit is forcibly created by disconnecting the load, such as a motor, from the power storage unit at this stage, and the terminal voltage at the load-release state is measured after a certain period of time. The characteristics of the remaining charge with respect to the terminal voltage at the load-release state are not related to the deterioration of the power storage unit, i.e., the increase in the internal resistance thereof, and they are almost the same as those in a power storage unit having no deterioration, e.g., at the initial state thereof. For this reason, the remaining charge of the power storage unit may be obtained with high accuracy by providing a predetermined relational expression or map which shows the relationship between the terminal voltage and the remaining charge at the load-release state, and by searching the relational expression or map.

In this manner, it becomes possible to calibrate the remaining charge detected at the load-connected state by using the remaining charge which is accurately detected at the load-release state. Accordingly, the remaining charge may be calculated with high accuracy even if the power storage unit is in the load-connected state by setting, for instance, correction coefficients for calibration.

In accordance with another aspect of the invention, the remaining charge detection device for a power storage unit further includes a standard remaining charge calibration unit (for instance, a remaining charge correction unit 22 in an embodiment of the invention which will be described later) which calibrates, based on the remaining charge for calibration calculated by the remaining charge for calibration calculation unit, a predetermined standard remaining charge (for instance, a standard charge SOCf in an embodiment of the invention which will be described later) which may be used when the remaining charge of the power storage unit is expressed as a percentage with respect to the predetermined standard remaining charge.

The present invention also provides a control device for a hybrid vehicle including an engine (for instance, an engine 12 in an embodiment of the invention which will be described later) which outputs a driving force for the hybrid vehicle, a motor (for instance, a motor 11 in an embodiment of the invention which will be described later) which assists an output of the engine in accordance with a driving state of the hybrid vehicle, and a power storage unit which stores energy generated by the motor used as a generator and regenerative energy obtained by the regenerative operation of the motor when the hybrid vehicle decelerates, wherein the control device for a hybrid vehicle includes a remaining charge detection device for the power storage unit, having a current detection unit which detects the current value of a charging current and a discharging current of the power storage unit, a voltage detection unit which detects the voltage value of a terminal voltage of the power storage unit, a current accumulation remaining charge calculation means which accumulates the current value detected by the current detection unit to obtain an accumulated charging current and an accumulated discharging current and, based on the accumulated charging current and the accumulated discharging current, calculates a remaining charge of the power storage unit, a no-load state generation unit (for instance, a current consumer releasing unit 23 in an embodiment of the invention which will be described later) which creates a no-load state for the power storage unit by terminating the output assistance for the engine by the motor and the regenerative operation of the motor; a no-load state detection unit (for instance, also a current consumer releasing unit 23 in an embodiment of the invention which will be described later) which detects the no-load state of the power storage unit; and a remaining charge for calibration calculation unit which calculates, according to the voltage value detected in the no-load state of the power storage unit, a remaining charge for calibration with respect to the remaining charge of the power storage unit.

According to the above control device for a hybrid vehicle, it becomes possible to generate a no-load state of the power storage unit by forcibly creating a state in which the output assistance level and the amount of power regeneration are decreased to zero by inhibiting an output assist operation for the engine by the motor or a regeneration operation of the motor when a hybrid vehicle is decelerated.

In accordance with another aspect of the invention, the current accumulation remaining charge calculation means calculates a remaining charge of the power storage unit while the hybrid vehicle is in a running mode.

In accordance with another aspect of the invention, the control device for a hybrid vehicle further includes a remaining charge correction unit (for instance, a correction determination voltage calculation unit 21 in an embodiment of the invention which will be described later) which retains a predetermined remaining charge (for instance, an upper limit remaining charge $SOC_{MAP}$ and a lower limit remaining charge $SOC_{MAP}$ in an embodiment of the invention which will be described later) that has been set in accordance with a predetermined voltage value (for instance, a voltage value V, an upper limit map voltage value Vmu, or a lower limit map voltage value Vmd in an embodiment of the invention which will be described later), current value (for instance, a current value I in an embodiment of the invention which will be described later), and temperature (for instance, a temperature T in an embodiment of the invention which will be described later) for the power storage unit, the remaining charge correction unit being capable of setting, when the voltage value detected by the voltage detection unit reaches the predetermined voltage value (for instance, the upper limit map voltage value Vmu or the lower limit map voltage value Vmd in an embodiment of the invention which will be described later), the predetermined remaining charge as the remaining charge of the power storage unit, wherein the no-load state generation unit creates the no-load state for the power storage unit when the remaining charge of the power storage unit is corrected by the remaining charge correction unit.

According to the above control device for a hybrid vehicle, a predetermined map for correcting the remaining charge is prepared for correcting the remaining charge calculated by the current accumulation method, and when the condition of the power storage unit is matched with a condition indicated in the map for correcting the remaining charge, a no-load state for the power storage unit may be forcibly generated.

That is, the map for correcting the remaining charge is set for a predetermined remaining charge and, for instance, when the detected value of the terminal voltage of the power storage unit reaches a predetermined voltage value which is set by the map for correcting the remaining charge, a no-load state may be forcibly created in the hybrid vehicle by decreasing the level of output assistance for the engine and the amount of power regeneration to zero. After a certain period of time which is required for stabilizing the no-load state of the power storage unit, the remaining charge of the power storage unit is calculated based on the terminal voltage thereof in the no-load state, and the remaining charge calculated by the current accumulation method is calibrated by using the remaining charge in the no-load state.

In this manner, it becomes possible to avoid stopping the engine output assistance or the regeneration operation of the motor while the vehicle is running, and therefore, to prevent uncomfortableness in driving the vehicle.

In yet another aspect of the invention, the control device for a hybrid vehicle further includes a remaining charge for correction calibration unit (for instance, a remaining charge correction unit 22 in an embodiment of the invention which will be described later) which calibrates the predetermined remaining charge based on the remaining charge for calibration calculated by the remaining charge for calibration calculation unit.

According to the above control device for a hybrid vehicle, the predetermined remaining charge with respect to the remaining charge correction map is calibrated based on the remaining charge in the no-load state. That is, a correction coefficient is calculated based on the remaining charge in the no-load state and the predetermined remaining charge with respect to the remaining charge correction map, and the correction coefficient is applied to, for instance, the voltage value with respect to the remaining charge correction map to renew the remaining charge correction map. For example, for the remaining charge correction map which is set for a predetermined upper limit remaining charge, the correction coefficient may be applied to the upper limit voltage so that the upper limit voltage is increased corresponding to the deterioration of the power storage unit caused by, for instance, the increase in the internal resistance thereof. In this manner, it becomes possible to accurately detect the remaining charge of the power storage unit by, for instance, preventing the detected terminal voltage from reaching the upper limit voltage before the actual remaining charge of the power storage unit reaches the predetermined upper limit remaining charge.

In yet another aspect of the invention, the control device for a hybrid vehicle further includes a standard remaining charge calibration unit (for instance, also the remaining charge correction unit 22 in an embodiment of the invention which will be described later) which calibrates, based on the remaining charge for calibration calculated by the remaining charge for calibration calculation unit, a predetermined standard remaining charge (for instance, a standard charge SOCf in an embodiment of the invention which will be described later) which may be used when the remaining charge of the power storage unit is expressed as a percentage with respect to the predetermined standard remaining charge.

According to the above control device for a hybrid vehicle, when the remaining charge of the power storage unit is expressed as a percentage with respect to the predetermined standard remaining charge, i.e., as a relative value, from the viewpoint of comfortableness in controlling devices, such as a motor or an engine, which are driven by electric power supplied from the power storage unit, a correction coefficient is calculated based on the remaining charge in the no-load state and the predetermined remaining charge with respect to the remaining charge correction map and applied to the standard charge. In this manner, it becomes possible to accurately calculate the remaining charge of the power storage unit regardless of the increase in the internal resistance associated with the deterioration of the power storage unit when, for instance, a remaining charge which is calculated by a current accumulation is expressed as a percentage with respect to the standard charge.

The present invention also provides a hybrid vehicle provided with a remaining charge detection device for a power storage unit. The remaining charge detection device includes a current detection unit which detects the current value of a charging current and a discharging current of a power storage unit; a voltage detection unit which detects the voltage value of a terminal voltage of the power storage unit; and a current accumulation remaining charge calculation means which calculates the accumulation of the current value detected by the current detection unit to obtain an accumulated charging current and an accumulated discharging current and, based on the accumulated charging current and the accumulated discharging current, calculates a remaining charge of the power storage unit. The remaining charge detection device further includes a no-load state detection unit which detects a no-load state of the power storage unit; and a remaining charge for calibration calculation unit which calculates, according to the voltage value detected in the no-load state of the power storage unit, a remaining charge for calibration with respect to the remaining charge of the power storage unit.

In accordance with another aspect of the invention, the remaining charge detection device for a power storage unit of a hybrid vehicle further includes a standard remaining charge calibration unit which calibrates, based on the remaining charge for calibration calculated by the remaining charge for calibration calculation unit, a predetermined standard remaining charge which may be used when the remaining charge of the power storage unit is expressed as a percentage with respect to the predetermined standard remaining charge.

BRIEF DESCRIPTION OF THE DRAWINGS

Some of the features and advantages of the invention have been described, and others will become apparent from the detailed description that follows and from the accompanying drawings, in which.

DETAILED DESCRIPTION OF THE INVENTION

The invention summarized above and defined by the enumerated claims may be better understood by referring to the following detailed description, which should be read with reference to the accompanying drawings. This detailed description of a particular preferred embodiment, set out below to enable one to build and use one particular implementation of the invention, is not intended to limit the enumerated claims, but to serve as a particular example thereof.

Figure 1:
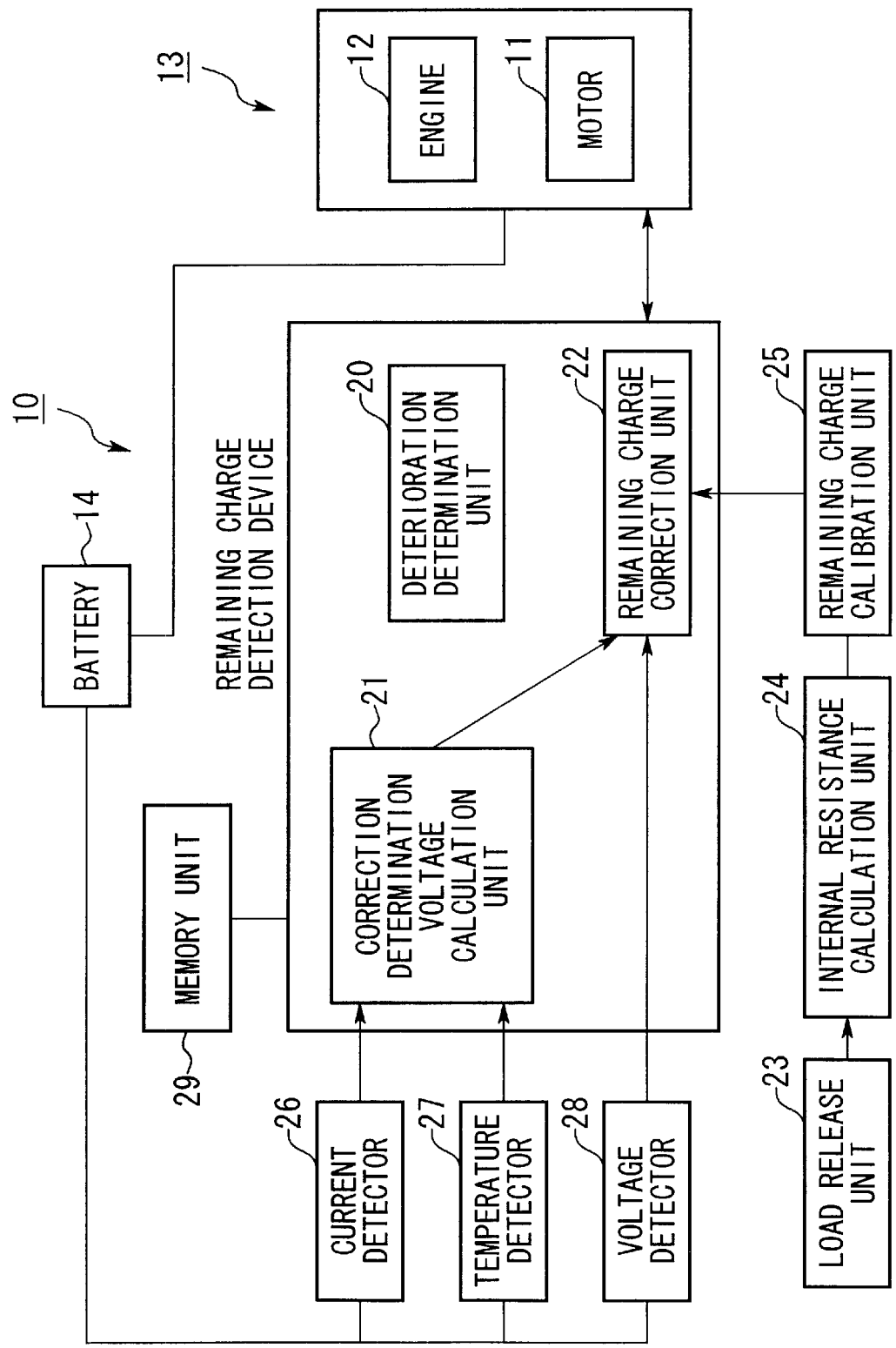
FIG. 1 is a block diagram showing the schematic configuration of a remaining charge detection device for a power storage unit according to an embodiment of the invention.

FIG. 1 is a block diagram showing the schematic configuration of a remaining charge detection device 10 for a power storage unit according to an embodiment of the invention.

The remaining charge detection device 10 for a power storage unit according to this embodiment of the invention (hereinafter simply referred to as the remaining charge detection device 10) may be used, for instance, for a hybrid vehicle and, as shown in FIG. 1, may be connected to a hybrid control unit 13 which controls a motor 11 and an engine 12. The remaining charge detection device 10 detects the remaining charge of a power storage unit, such as a battery 14, which stores energy generated by the motor 11 used as a generator and regenerative energy obtained by a regenerative operation of the motor 11 when the vehicle is decelerating.

The remaining charge detection device 10 includes a deterioration determination unit 20, a correction determination voltage calculation unit 21, a remaining charge correction unit 22, a current consumer releasing unit 23, an internal resistance calculation unit 24, and a remaining charge for calibration calculation unit 25. The remaining charge detection device 10, for instance, estimates the charging current and the discharging current of the battery 14 to calculate the accumulated charge amount and the accumulated discharge amount, and carries out a calibration process for the remaining charge (i.e., the current accumulation remaining charge $SOC_I$) of the battery 14, which is obtained by adding/subtracting the accumulated charge amount and the accumulated discharge amount to/from the initial remaining charge/the remaining charge just before the charging-discharging process (i.e., the initial detection $SOC_i$). The remaining charge detection device 10 then outputs the signal of the calibrated remaining charge to, for instance, the hybrid control unit 13 or a remaining charge display device (not shown in the figure) provided with a display panel for an occupant.

The remaining charge detection device 10 according to an embodiment of the present invention receives a signal of the current value I output from a current detector 26 which detects the discharging current supplied from the battery 14 to a load member, such as the motor 11 and a generator, and the charging current supplied from a loading device to the battery 14, a signal of the temperature T output from a temperature detector 27 which detects the temperature of the battery 14, and a signal of the voltage value V output from a voltage detector 28 which detects the terminal voltage Vb of the battery 14.

Note that the remaining charge detection device 10 includes a memory unit 29 which stores a deterioration correction coefficient α that is referred to when the calibration of the current accumulation remaining charge $SOC_I$ is carried out.

The deterioration determination unit 20, as will be described later, determines the deterioration of the battery 14 by determining if the difference between a remaining charge $SOC_{OCV}$ calculated for the battery 14 in the no-load state and the remaining charge thereof with respect to predetermined remaining charge correction maps (for instance, an upper limit remaining charge $SOC_{MAP}$ and a lower limit remaining charge $SOC_{MAP}$) exceeding a predetermined threshold value.

The correction determination voltage calculation unit 21 includes a remaining charge correction map which is, for instance, prepared by using the voltage characteristic of the battery 14 at a stationary state and without any deterioration (e.g., at an initial state thereof), i.e., a map showing the relationship among the current value I, the voltage value V, and the temperature T at a predetermined remaining charge of the battery 14.

Also, the correction determination voltage calculation unit 21, for instance, refers to each remaining charge correction map for the predetermined upper limit remaining charge $SOC_{MAP}$ and the lower limit remaining charge $SOC_{MAP}$, which are provided from the viewpoint of protecting and prolonging the life of the battery 14, and obtains, by searching the map, an upper limit map voltage value Vmu, at which the current accumulation remaining charge $SOC_I$ calculated by the current accumulation method reaches a predetermined upper limit remaining charge $SOC_{MAP}$, and a lower limit map voltage value Vmd, at which the current accumulation remaining charge $SOC_I$ reaches a predetermined lower limit remaining charge $SOC_{MAP}$.

The remaining charge correction unit 22 carries out a correction operation of the current accumulation remaining charge $SOC_I$ based on the remaining charge for calibration calculated by the remaining charge for calibration calculation unit 25 (which will be described later), i.e., based on the remaining charge $SOC_{OCV}$ in the no-load state.

The current consumer releasing unit 23 forcibly creates the no-load state of the battery 14, for instance, in a hybrid vehicle, by decreasing an output assistance level for engine 12 by the motor 11 and the amount of regenerative power generation by the motor 11 to zero.

The internal resistance calculation unit 24, as will be described later, corrects the internal resistance R which is increased by the deterioration of the battery 14 by using the deterioration correction coefficient α which is determined based on the remaining charge $SOC_{OCV}$ in the no-load state and the predetermined upper limit remaining charge $SOC_{MAP}$ or the lower limit remaining charge $SOC_{MAP}$ with respect to the remaining charge correction map.

The remaining charge for calibration calculation unit 25 calculates the remaining charge $SOC_{OCV}$ in the no-load state based on the terminal voltage OCV of the battery 14 in the no-load state, by searching a map showing the relationship between the terminal voltage OCV and the remaining charge $SOC_{OCV}$, which is prepared, for instance, by using the voltage characteristic of the battery 14 in the no-load state without any deterioration (e.g., at an initial state thereof).

Next, operation of the remaining charge detection device 10 for a power storage unit according to an embodiment of the present invention having the above-mentioned structure will be explained with reference to the attached drawings.

Figure 2:
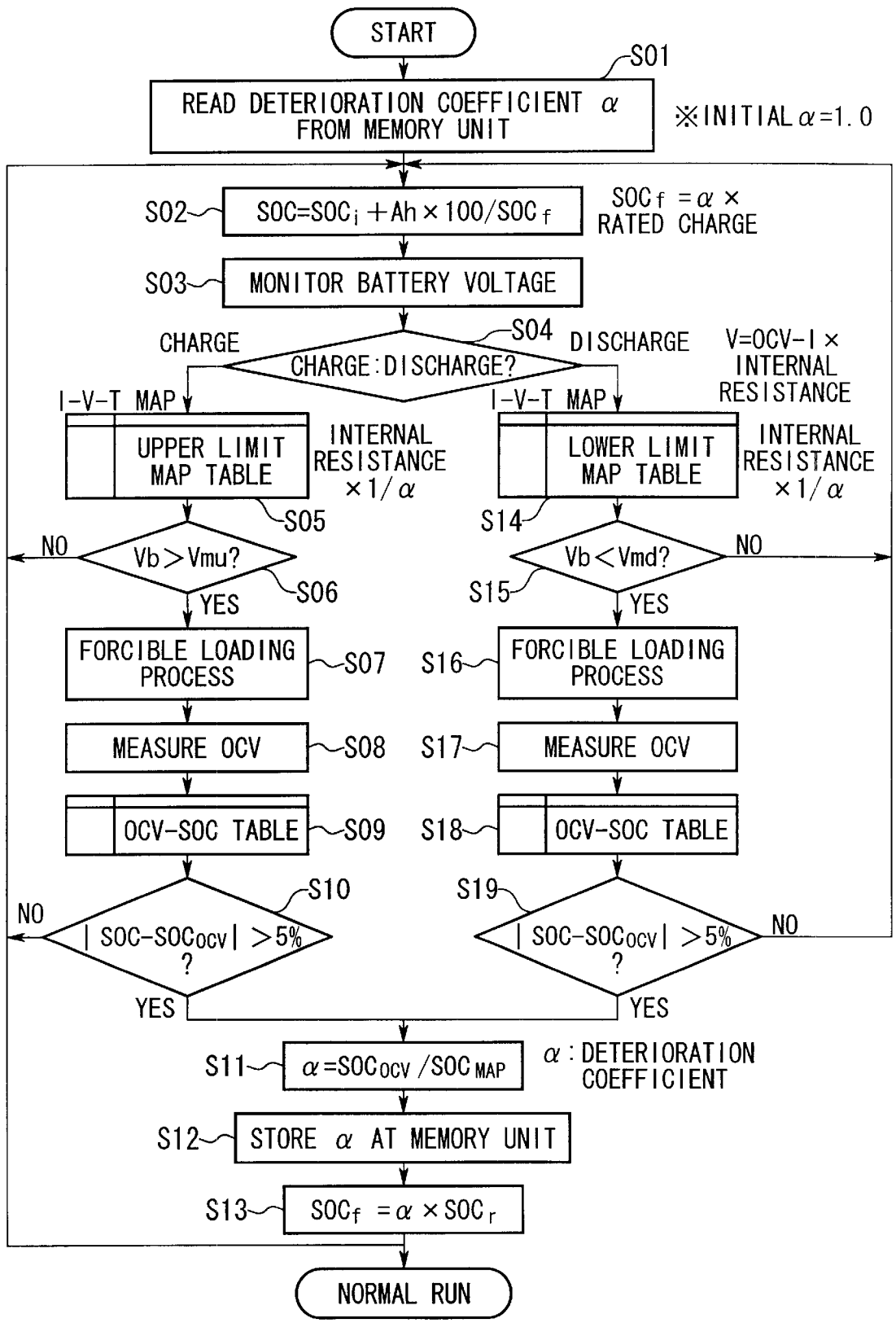
FIG. 2 is a flowchart for showing an operation of the remaining charge detection device shown in FIG. 1.
Figure 3A:
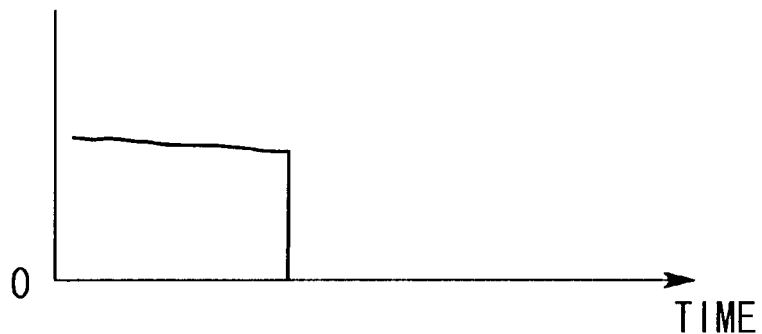
FIG. 3A is a graph showing changes in the level of regeneration when a current accumulation remaining charge $SOC_I$ is corrected with respect to, for instance, a battery in which a charging state has been maintained since the initial state thereof.
Figure 3B:
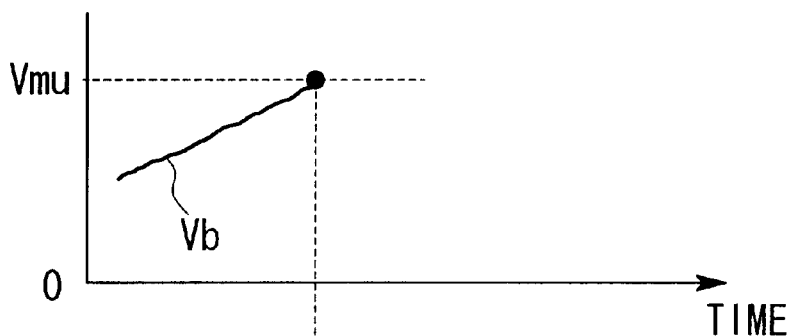
FIG. 3B is a graph showing changes in the terminal voltage when a current accumulation remaining charge $SOC_I$ is corrected with respect to, for instance, a battery in which a charging state has been maintained since the initial state thereof.
Figure 3C:
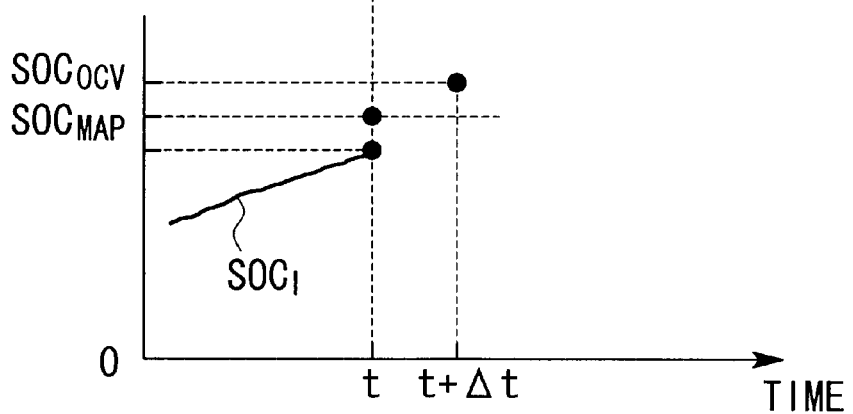
FIG. 3C is a graph showing changes in the remaining charge when a current accumulation remaining charge $SOC_I$ is corrected with respect to, for instance, a battery in which a charging state has been maintained since the initial state thereof.

FIG. 2 is a flowchart for showing the operation of the remaining charge detection device 10. FIGS. 3A through 3C are graphs showing changes in the level of regeneration (FIG. 3A), changes in the terminal voltage (FIG. 3B), and changes in the remaining charge (FIG. 3C) when the current accumulation remaining charge $SOC_I$ is corrected with respect to, for instance, the battery 14 in which a charging state has been maintained since the initial state thereof.

In the remaining charge calculation process shown in FIG. 2, a series of steps may be started, for instance, by turning on the ignition switch to start the engine 12.

In step S01, the deterioration correction coefficient a is read from the memory unit 29. Note that "1" may be set as the initial value of the deterioration correction coefficient a for the first process of the battery 14 (i.e., in its initial state, etc.).

Next in step S02, an ampere-hour current Ah (for instance, a positive value with respect to the charging current), which includes the accumulated charge amount and the accumulated discharge amount, is calculated by estimating, for instance, the current value I of the charging current and the discharging current of the battery 14 using the equation (1) shown below. The ampere-hour current Ah may be expressed as a percentage with respect to the standard charge SOCf, which will be described later, and added to the initial state of the battery 14 or the remaining charge of the battery 14 detected just before the charging-discharging operation, i.e., the initial detection value SOCi, to obtain the detected remaining charge SOC.

$$SOC=SOCi+Ah\times100/SOCf \qquad (1)$$

Note that the standard charge SOCf is a value which is obtained by multiplying a rated charge SOCr of the battery 14 by the deterioration correction coefficient α, as will be described later. The standard charge SOCf is equal to the rated charge SOCr when the battery 14 is in a non-deteriorated state.

In step S03, the terminal voltage Vb of the battery 14 is detected by the voltage detector 28.

In step S04, it is determined if the battery 14 is in its charging state or discharging state.

If it is determined that the battery 14 is in its charging state, the process proceeds to step S05. On the other hand, if it is determined that the battery 14 is in its discharging state, the process proceeds to step S14, which will be described later.

In step S05, the upper limit map voltage value Vmu is calculated by searching the upper limit remaining charge map which is set for the predetermined upper limit remaining charge $SOC_{MAP}$. In this case, as shown in the equation (2) below, the value of the upper limit map voltage value Vmu, for example, is varied so as to correspond to the increase in the internal resistance R associated with the deterioration of the battery 14 by multiplying the internal resistance R by an inverse of the deterioration correction coefficient α so that the deterioration correction coefficient α is reflected in the upper limit map voltage value Vmu. Note that in equation (2), the current value I indicates the charging current.

$$Vmu=OCV-I\times R/\alpha \qquad (2)$$

Next, in step S06, it is determined if the terminal voltage Vb of the battery 14 is greater than the upper limit map voltage Vmu.

If the result of the determination is "YES", then the process proceeds to step S07 whereas if the result of the determination is "NO", then the operation described in step S02 and thereafter will be carried out.

In step S07, a forcible loading process is carried out for a predetermined period of time (for instance, one second). That is, in a hybrid vehicle, for instance, the amount of regenerative power generation is decreased to zero, and the no-load state of the battery 14 is forcibly created.

Next, in step S08, the terminal voltage OCV of the battery 14 in the no-load state is measured.

In step S09, based on the detected terminal voltage OCV of the battery 14 in the no-load state, for instance, the remaining charge $SOC_{OCV}$ in the no-load state is calculated by searching the map which is prepared based on the voltage characteristic of the battery 14 in the no-load state (i.e., the battery 14 is without any deterioration (e.g., in the initial state thereof)). The map shows the relationship between the terminal voltage OCV and the remaining charge $SC_{OCV}$.

In step S10, it is determined if the absolute value of the difference between the detected remaining charge SOC and the remaining charge $SOC_{OCV}$ in the no-load state is greater than a predetermined value (for instance, 5%).

If the determination result is "YES", then the process proceeds to step S11. On the other hand, if the determination result is "NO", then the operation described in step S02 and thereafter will be performed.

Next, in step S11, a value obtained by dividing the remaining charge $SOC_{OCV}$ in the no-load state by the predetermined upper limit remaining charge $SOC_{MAP}$ with respect to the upper limit remaining charge map, or by the predetermined lower limit remaining charge $SOC_{MAP}$ with respect to the lower limit remaining charge map, is set as the deterioration correction coefficient α.

Then, in step S12, the obtained deterioration correction coefficient α is stored in the memory unit 29.

In step S13, a value obtained by multiplying the rated charge SOCr of the battery 14 by the deterioration correction coefficient α is set as the standard charge SOCf, and the series of above-mentioned operations are terminated.

On the other hand, in step S14, the lower limit map voltage Vmd is calculated by searching the lower limit remaining charge map which is set for the predetermined lower limit remaining charge $SOC_{MAP}$. In this case, as shown in the equation (3) below, for instance, the value of the lower limit map voltage value Vmd is varied so as to correspond to the increase in the internal resistance R associated with the deterioration of the battery 14 by multiplying the internal resistance R by an inverse of the deterioration correction coefficient α so that the deterioration correction coefficient α is reflected in the lower limit map voltage value Vmd. Note that in equation (3), the current value I indicates the discharging current.

$$Vmd=OCV-I\times R/\alpha \qquad (3)$$

Next, in step S15, it is determined if the terminal voltage Vb of the battery 14 is smaller than the lower limit map voltage Vmd.

If the result of determination is "YES", then the process proceeds to step S16 whereas the result of determination is "NO", then the operation described in step S02 and thereafter will be carried out.

In step S16, a forcible loading process is carried out for a predetermined period of time (for instance, one second). That is, in a hybrid vehicle, for instance, the output assistance level of the engine 12 is decreased to zero, and the no-load state of the battery 14 is forcibly created.

Next, in step S17, the terminal voltage OCV of the battery 14 in the no-load state is measured.

In step S18, based on the detected terminal voltage OCV in the no-load state, for instance, the remaining charge $SOC_{OCV}$ in the no-load state is calculated by searching the map which is prepared based on the voltage characteristic of the battery 14 in the no-load state (i.e., the battery 14 has no deterioration (e.g., at its initial state thereof)) and shows the relationship between the terminal voltage OCV and the remaining charge $SOC_{OCV}$.

In step S19, it is determined if the absolute value of the difference between the detected remaining charge SOC and the remaining charge $SOC_{OCV}$ in the no-load state is greater than a predetermined value (for instance, 5%).

If the determination result is "YES", then the process proceeds to step S11. On the other hand, if the determination result is "NO", then the operation described in step S02 and thereafter will be performed.

That is, for instance, as shown in FIGS. 3A through 3C, if the current accumulation remaining charge SOC (i.e., $SOC_I$ shown in FIG. 3C as a solid line) is calculated by the current accumulation method for the battery 14 in which the charging state has been maintained since its initial state and the internal resistance R of the battery 14 is increased due to deterioration, the upper limit map voltage value Vmu in the upper limit remaining charge map which is set for the predetermined upper limit remaining charge $SOC_{MAP}$ is decreased in accordance with the equation:

$$Vmu = OCV - I \times R$$

and the terminal voltage Vb of the battery 14 detected by the voltage detector 28 reaches the upper limit map voltage value Vmu at time t before the actual remaining charge SOC reaches the predetermined upper limit remaining charge $SOC_{MAP}$.

Accordingly, if the current accumulation remaining charge $SOC_I$ is calibrated by using the upper limit remaining charge $SOC_{MAP}$ in this state, the resulting calibrated current accumulation remaining charge $SOC_I$ would be different from the actual remaining charge SOC.

Thus, the no-load state of the battery 14 is created by, for instance, forcibly stopping the regenerative operation at time t. Then, after a predetermined time Δt (for instance, one second) which is required for the stabilization of the no-load state of the battery 14, the terminal voltage OCV of the battery 14 in the no-load state is measured to calculate the remaining charge $SOC_{OCV}$ with respect to the terminal voltage OCV.

Since the $SOC_{OCV}$ is almost equal to the value of the battery 14 having no deterioration and in the no-load state (e.g., in its initial state) regardless of the increase in the internal resistance R associated with the deterioration of the battery 14, the remaining charge SOC of the battery 14 may be detected with high accuracy by calibrating the current accumulation remaining charge $SOC_I$ using the remaining charge $SOC_{OCV}$ in the no-load state.

Also, by correcting the upper limit remaining charge map based on the remaining charge $SOC_{OCV}$ in the no-load state, the current accumulation remaining charge $SOC_I$ may be calibrated with high accuracy by the upper limit remaining charge $SOC_{MAP}$.

When the upper limit remaining charge map is corrected, the upper limit map voltage value Vmu is increased by reflecting the deterioration correction coefficient α, which is the ratio of the remaining charge $SOC_{OCV}$ in the no-load state to the upper limit remaining charge $SOC_{MAP}$ as mentioned above, to the internal resistance R so that the actual remaining charge SOC reaches the predetermined upper limit remaining charge $SOC_{MAP}$ at the same time that the detected terminal voltage Vb of the battery 14 reaches the upper limit map voltage value Vmu at time t.

As mentioned above, according to the remaining charge detection device 10 of an embodiment of the present invention, the remaining charge SOC may be detected, with high accuracy, by correcting the current accumulation remaining charge $SOC_I$ based on the remaining charge $SOC_{OCV}$ of the battery 14 in the no-load state even if the difference between the current accumulation remaining charge $SOC_I$ and the actual remaining charge SOC of the battery 14 is increased by, for instance, an increase in the internal resistance R of the battery 14 due to, for example, a low temperature or the deterioration of the battery, a transient state of the battery 14 in which current drifting is frequently generated, or a high level output period in which the amount of discharging current is increased.

Also, the current accumulation remaining charge $SOC_I$ may be calibrated with high accuracy using the upper and lower limit remaining charges $SOC_{MAP}$ by correcting the voltage value V for the predetermined remaining charge correction map (for instance, the upper limit map voltage Vmu and the lower limit map voltage Vmd) which is used for correcting the current accumulation remaining charge $SOC_I$, such as the upper limit remaining charge map and the lower limit remaining charge map, based on the remaining charge $SOC_{OCV}$ for the battery 14 in the no-load state.

Moreover, for the case where the remaining charge SOC of the battery 14 is expressed as a percentage (%) with respect to the standard charge SOCf due to a convenience for controlling, for instance, the motor 11 and the engine 12, it becomes possible to appropriately control the motor 11 and the engine 12 by using the remaining charge SOC of high accuracy even if the battery 14 has deteriorated because the standard charge SOCf is corrected based on the remaining charge $SOC_{OCV}$ of the battery 14 in the no-load state.

Note that although the value which is obtained by dividing the remaining charge $SOC_{OCV}$ in the no-load state by the upper limit or the lower limit remaining charge $SOC_{MAP}$ is used as the deterioration correction coefficient α in the above-mentioned embodiment of the present invention, it is not limited as such and it is possible to correct, for instance, the voltage value V and the remaining charge with respect to the predetermined remaining charge correction map and the standard remaining charge SOCf by using another coefficient which may be converted into the deterioration correction coefficient α.

For example, although the upper limit map voltage Vmu and the lower limit map voltage Vmd are corrected by multiplying the inverse of the deterioration correction coefficient α by the internal resistance R in the above-mentioned embodiment, it is possible to correct the voltage value, for instance, by using the correction coefficient α1 shown in the equation (4) below, and setting the value obtained by multiplying the correction coefficient α1 by the upper limit map voltage Vmu and the lower limit map voltage Vmd, respectively, as a new upper limit map voltage Vmu and a lower limit map voltage Vmd:

$$\alpha 1 = \left(\frac{SOCocv - SOCmap}{SOCmap}\right) + 1.0 \tag{4}$$

Having thus described an exemplary embodiment of the invention, it will be apparent that various alterations, modifications, and improvements will readily occur to those skilled in the art. Such alterations, modifications, and improvements, though not expressly described above, are nonetheless intended and implied to be within the spirit and scope of the invention. Accordingly, the foregoing discussion is intended to be illustrative only; the invention is limited and defined only by the following claims and equivalents thereto.

What is claimed is:

1. A remaining charge detection device for a power storage unit including: a current detection unit which detects the current value of a charging current and a discharging current of a power storage unit; a voltage detection unit which detects the voltage value of a terminal voltage of said power storage unit; and a current accumulation remaining charge calculation means which accumulates the current value detected by said current detection unit to obtain an accumulated charging current and an accumulated discharging current and, based on said accumulated charging current and said accumulated discharging current, calculates a remaining charge of said power storage unit, said remaining charge detection device further comprising:

a no-load state detection unit which detects a no-load state of said power storage unit; and a remaining charge for calibration calculation unit which calculates, according to the voltage value detected in the no-load state of said power storage unit, a remaining charge for calibration with respect to said remaining charge of said power storage unit.

2. A remaining charge detection device for a power storage unit according to claim 1, further comprising:

a standard remaining charge calibration unit which calibrates, based on said remaining charge for calibration calculated by said remaining charge for calibration calculation unit, a predetermined standard remaining charge which may be used when said remaining charge of said power storage unit is expressed as a percentage with respect to said predetermined standard remaining charge.

3. A control device for a hybrid vehicle including an engine which outputs a driving force for the hybrid vehicle, a motor which assists an output of the engine in accordance with a driving state of the hybrid vehicle, and a power storage unit which stores energy generated by the motor used as a generator and regenerative energy obtained by a regenerative operation of said motor when said hybrid vehicle is decelerating, said control device for a hybrid vehicle comprising:

a remaining charge detection device for said power storage unit, including:

a current detection unit which detects the current value of a charging current and a discharging current of said power storage unit;

a voltage detection unit which detects the voltage value of a terminal voltage of said power storage unit;

a current accumulation remaining charge calculation means which calculates the accumulation of the current value detected by said current detection unit to obtain an accumulated charging current and an accumulated discharging current and, based on said accumulated charging current and said accumulated discharging current, calculates a remaining charge of said power storage unit;

a no-load state generation unit which creates a no-load state of said power storage unit by terminating the output assistance of said engine by said motor and the regenerative operation of said motor;

a no-load state detection unit which detects the no-load state of said power storage unit; and a remaining charge for calibration calculation unit which calculates, according to the voltage value detected in the no-load state of said power storage unit, a remaining charge for calibration with respect to said remaining charge of said power storage unit.

4. A control device for a hybrid vehicle according to claim 3, wherein said current accumulation remaining charge calculation means calculates a remaining charge of said power storage unit while said hybrid vehicle is in a running mode.

5. A control device for a hybrid vehicle according to claim 3, further comprising:

a remaining charge correction unit which retains a predetermined remaining charge that has been set in accordance with a predetermined voltage value, current value, and temperature for said power storage unit, said remaining charge correction unit being capable of setting, when said voltage value detected by said voltage detection unit reaches said predetermined voltage value, said predetermined remaining charge as said remaining charge of said power storage unit, wherein said no-load state generation unit creates the no-load state of said power storage unit when said remaining charge of said power storage unit is corrected by said remaining charge correction unit.

6. A control device for a hybrid vehicle according to claim 3, further comprising:

a remaining charge for correction calibration unit which calibrates said predetermined remaining charge based on said remaining charge for calibration calculated by said remaining charge for calibration calculation unit.

7. A control device for a hybrid vehicle according to claim 3, further comprising:

a standard remaining charge calibration unit which calibrates, based on said remaining charge for calibration calculated by said remaining charge for calibration calculation unit, a predetermined standard remaining charge which may be used when said remaining charge of said power storage unit is expressed as a percentage with respect to said predetermined standard remaining charge.

8. A control device for a hybrid vehicle according to claim 4, further comprising:

a standard remaining charge calibration unit which calibrates, based on said remaining charge for calibration calculated by said remaining charge for calibration calculation unit, a predetermined standard remaining charge which may be used when said remaining charge of said power storage unit is expressed as a percentage with respect to said predetermined standard remaining charge.

9. A control device for a hybrid vehicle according to claim 5, further comprising:

a standard remaining charge calibration unit which calibrates, based on said remaining charge for calibration calculated by said remaining charge for calibration calculation unit, a predetermined standard remaining charge which may be used when said remaining charge of said power storage unit is expressed as a percentage with respect to said predetermined standard remaining charge.

10. A control device for a hybrid vehicle according to claim 6, further comprising:

a standard remaining charge calibration unit which calibrates, based on said remaining charge for calibration calculated by said remaining charge for calibration calculation unit, a predetermined standard remaining charge which may be used when said remaining charge of said power storage unit is expressed as a percentage with respect to said predetermined standard remaining charge.

11. A hybrid vehicle provided with a remaining charge detection device for a power storage unit including:

a current detection unit which detects the current value of a charging current and a discharging current of a power storage unit;

a voltage detection unit which detects the voltage value of a terminal voltage of said power storage unit; and a current accumulation remaining charge calculation means which accumulates the current value detected by said current detection unit to obtain an accumulated charging current and an accumulated discharging current and, based on said accumulated charging current and said accumulated discharging current, calculates a remaining charge of said power storage unit, said remaining charge detection device further comprising:
- a no-load state detection unit which detects a no-load state of said power storage unit; and
- a remaining charge for calibration calculation unit which calculates, according to the voltage value detected in the no-load state of said power storage unit, a remaining charge for calibration with respect to said remaining charge of said power storage unit.

12. A hybrid vehicle according to claim 11, wherein said remaining charge detection device for a power storage unit further comprising:
- a standard remaining charge calibration unit which calibrates, based on said remaining charge for calibration calculated by said remaining charge for calibration calculation unit, a predetermined standard remaining charge which may be used when said remaining charge of said power storage unit is expressed as a percentage with respect to said predetermined standard remaining charge.

* * * * *